United States Patent
Wang et al.

(10) Patent No.: US 9,509,137 B2
(45) Date of Patent: Nov. 29, 2016

(54) ELECTROSTATIC DISCHARGE PROTECTION DEVICE

(71) Applicant: MACRONIX International Co., Ltd., Hsinchu (TW)

(72) Inventors: Shih-Yu Wang, Hsinchu (TW); Tao-Cheng Lu, Hsinchu (TW); Yao-Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 251 days.

(21) Appl. No.: 14/272,115

(22) Filed: May 7, 2014

(65) Prior Publication Data

US 2015/0194808 A1    Jul. 9, 2015

Related U.S. Application Data

(60) Provisional application No. 61/923,782, filed on Jan. 6, 2014.

(51) Int. Cl.
  *H02H 3/20*    (2006.01)
  *H02H 9/04*    (2006.01)
  *H01L 27/02*   (2006.01)

(52) U.S. Cl.
  CPC .......... *H02H 9/046* (2013.01); *H01L 27/0259* (2013.01)

(58) Field of Classification Search
  CPC .................................. H02H 3/20; H02H 9/04
  USPC .......................................................... 361/56
  See application file for complete search history.

(56) References Cited

U.S. PATENT DOCUMENTS

| | | | |
|---|---|---|---|
| 5,978,192 A * | 11/1999 | Young .................... | H02H 9/046 361/111 |
| 6,353,520 B1 * | 3/2002 | Andresen ............ | H01L 27/0251 361/56 |
| 7,339,770 B2 * | 3/2008 | Maloney ............. | H01L 27/0285 361/111 |

(Continued)

FOREIGN PATENT DOCUMENTS

| | | |
|---|---|---|
| TW | 201318148 | 5/2013 |
| TW | 201322408 | 6/2013 |
| WO | 2008102285 | 8/2008 |

OTHER PUBLICATIONS

"Office Action of Taiwan Counterpart Application", issued on Nov. 26, 2015, p. 1-p. 4.

*Primary Examiner* — Dharti Patel
(74) *Attorney, Agent, or Firm* — J.C. Patents

(57) ABSTRACT

An electrostatic discharge protection device including a PNP transistor, a protection circuit and an adjustment circuit is provided. An emitter of the PNP transistor is electrically connected to a pad, and a collector of the PNP transistor is electrically connected to a ground. The protection circuit is electrically connected between a base of the PNP transistor and the ground, and provides a discharge path. When an electrostatic signal occurs on the pad, the electrostatic signal is conducted to the ground through the discharge path and the PNP transistor. The adjustment circuit is electrically connected between the emitter and the base of the PNP transistor. When a power voltage is supplied to the pad, the adjustment circuit provides a control voltage to the base of the PNP transistor according to the power voltage, so as to prevent the emitter and the base of the PNP transistor from being forward biased.

6 Claims, 4 Drawing Sheets

(56) References Cited

U.S. PATENT DOCUMENTS

2012/0176707 A1* 7/2012 Vashchenko .......... H02H 9/046
361/56

2012/0287539 A1* 11/2012 Wang .................... H02H 9/046
361/56
2016/0172846 A1* 6/2016 Kotani ............. G01R 19/16523
361/56

* cited by examiner

ELECTROSTATIC DISCHARGE PROTECTION DEVICE

CROSS-REFERENCE TO RELATED APPLICATION

This application claims the priority benefits of U.S. provisional application Ser. No. 61/923,782, filed on Jan. 6, 2014. The entirety of the above-mentioned patent application is hereby incorporated by reference herein and made a part of this specification.

BACKGROUND

Technical Field

The invention relates to an electrostatic discharge protection device. Particularly, the invention relates to an electrostatic discharge protection device capable of avoiding a latch-up effect.

Related Art

Electrostatic discharge (ESD) is generally a main reason that causes electrostatic overstress or permanent damage of an integrated circuit, so that an ESD protection device is added to the integrated circuit to prevent the ESD from causing damage. However, the existing ESD protection device generally causes a latch-up effect, and an internal circuit is influenced by the ESD protection device. Therefore, to design an ESD protection device capable of avoiding the latch-up effect is a major challenge faced by various manufacturers.

SUMMARY

The invention is directed to an electrostatic discharge (ESD) protection device, in which an adjustment circuit is used to provide a control voltage to a base of a PNP transistor, so as to avoid a latch-up effect during a normal operation of an internal circuit.

The invention provides an electrostatic discharge protection device including a PNP transistor, a protection circuit and an adjustment circuit. An emitter of the PNP transistor is electrically connected to a pad, and a collector of the PNP transistor is electrically connected to a ground. The protection circuit is electrically connected between a base of the PNP transistor and the ground, and provides a discharge path. When an electrostatic signal occurs on the pad, the electrostatic signal is conducted to the ground through the discharge path and the PNP transistor. The adjustment circuit is electrically connected between the emitter and the base of the PNP transistor. When a power voltage is supplied to the pad, the adjustment circuit provides a control voltage to the base of the PNP transistor according to the power voltage, so as to prevent the emitter and the base of the PNP transistor from being forward biased.

According to the above descriptions, in the ESD protection device, the adjustment circuit is disposed between the emitter and the base of the PNP transistor, and a control voltage is provided to the base of the PNP transistor through the adjustment circuit. In this way, when the internal circuit normally operates, a forward biasing of the emitter and the base of the PNP transistor is prevented, so as to avoid occurrence of the latch-up effect.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
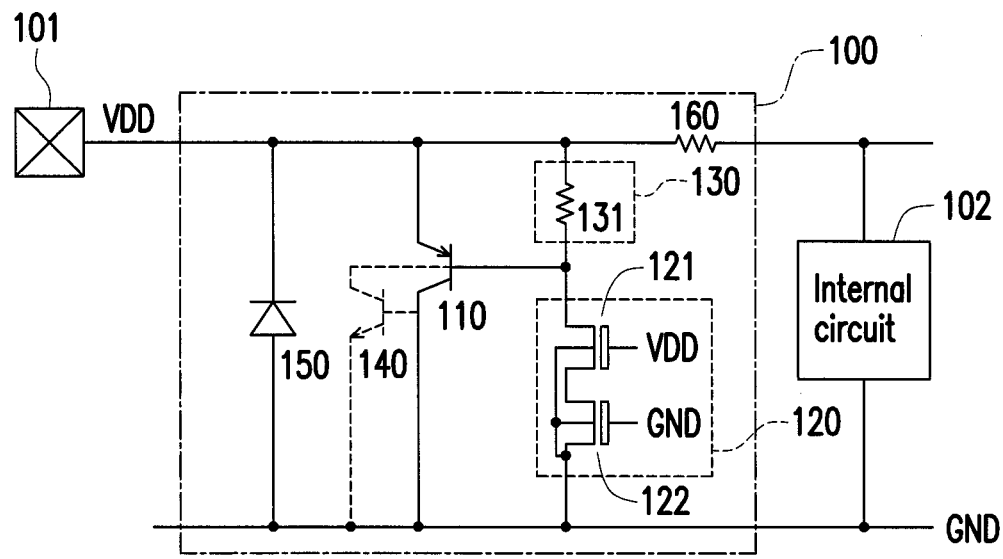
FIG. 1 is a schematic diagram of an electrostatic discharge (ESD) protection device according to an embodiment of the invention.

FIG. 1 is a schematic diagram of an electrostatic discharge (ESD) protection device according to an embodiment of the invention. Referring to FIG. 1, the ESD protection device 100 includes a PNP transistor 110, a protection circuit 120 and an adjustment circuit 130. An emitter of the PNP transistor 110 is electrically connected to a pad 101, and a collector of the PNP transistor 110 is electrically connected to a ground. The protection circuit 120 is electrically connected between a base of the PNP transistor 110 and the ground. The adjustment circuit 130 is electrically connected between the emitter and the base of the PNP transistor 110.

Further, the protection circuit 120 includes an NMOS transistor 121 and an NMOS transistor 122. A drain of the NMOS transistor 121 is electrically connected to the base of the PNP transistor 110, and a gate of the NMOS transistor 121 receives a power voltage VDD. Moreover, a drain of the NMOS transistor 122 is electrically connected to a source of the NMOS transistor 121, a gate of the NMOS transistor 122 receives a ground voltage GND, and a source of the NMOS transistor 122 is electrically connected to the ground. Regarding a layout structure, the two NMOS transistors 121 and 122 connected in series have a parasitic lateral NPN transistor, so that the protection circuit 120 can provide a discharge path. Moreover, the adjustment circuit 130 includes a resistor 131. A first end of the resistor 131 is electrically connected to the emitter of the PNP transistor 110, and a second end of the resistor 131 is electrically connected to the base of the PNP transistor 110.

In an actual application, the ESD protection device 100 can avoid an electrostatic signal come from the pad 101 from damaging an internal circuit 102 without influencing a normal operation of the internal circuit 102. For example, when an ESD event occurs, the electrostatic signal come from the pad 101 forward biases the emitter and the base of the PNP transistor 110, i.e. an emitter-base junction of the PNP transistor 110 is biased at a forward bias. In this way, a part of the electrostatic signal is conducted to the ground through the PNP transistor 110, and the other part of the electrostatic signal is conducted to the ground through the discharge path provided by the protection circuit 120. In other words, when the electrostatic signal occurs on the pad 101, the electrostatic signal can be conducted to the ground through the discharge path and the PNP transistor 110.

On the other hand, when the power voltage VDD is supplied to the pad 101, the internal circuit 102 normally operates. Moreover, the NMOS transistor 121 in the protection circuit 120 receives the power voltage VDD, and the NMOS transistor 122 receives the ground voltage GND. In this way, the signal come from the pad 101 is avoided to be conducted to the ground through the protection circuit 120, so as to suppress generation of a leakage current. Moreover, the adjustment circuit 130 provides a control voltage to the base of the PNP transistor 110 according to the power voltage VDD, so as to prevent the emitter and the base of the PNP transistor 110 from being forward biased. In this way, a latch-up effect of the ESD protection device 100 is avoided. In other words, when the internal circuit 102 normally operates, the ESD protection device 100 can suppress generation of the leakage current and can also avoid occurrence of the latch-up effect, so that the internal circuit 102 is not influenced by the ESD protection device 100.

Figure 2:
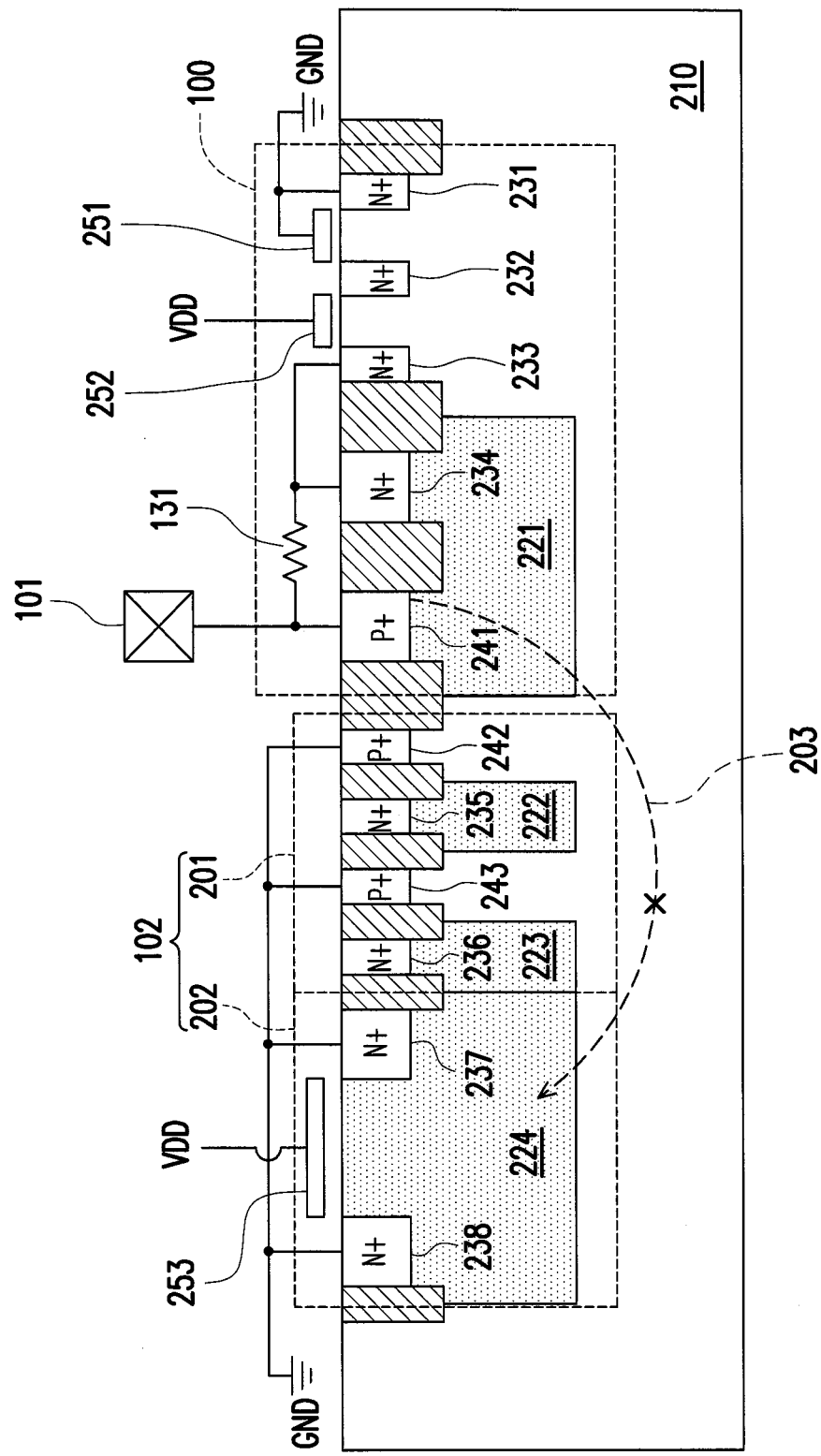
FIG. 2 is a layout cross-sectional view of an ESD protection device according to an embodiment of the invention.

For example, FIG. 2 is a layout cross-sectional view of an ESD protection device according to an embodiment of the invention. As shown in FIG. 2, a P+-type doped region 241, an N-type well 221 and a P-type substrate 210 respectively form the emitter, the base and the collector of the PNP transistor 110. Moreover, the base of the PNP transistor 110 (i.e. the N-type well 221) is electrically connected to the resistor 131 through an N+-type doped region 234. A gate structure 252, an N+-type doped region 233 and an N+-type doped region 232 respectively form the gate, the drain and the source of the NMOS transistor 121. Moreover, a gate structure 251, the N+-type doped region 232 and an N+-type doped region 231 respectively form the gate, the drain and the source of the NMOS transistor 122.

Regarding the layout structure, the PNP transistor 110 and an electronic element having an N-type well in the internal circuit 102 can construct a parasitic silicon controlled rectifier (SCR). For example, as shown in FIG. 2, the internal circuit 102 is generally configured with a guard ring 201 and a regulation capacitor 202 to prevent a noise interference and regulate the power voltage VDD. The guard ring 201 is composed of P+-type doped regions 242 and 243, N+-type doped regions 235 and 236, N-type wells 222 and 223 and the P-type substrate 210. The regulation capacitor 202 is composed of a gate structure 253, N+-type doped regions 237 and 238 and an N-type well 224.

It should be noticed that the P+-type doped region 241, the N-type well 221, the P-type substrate 210 and the N-type well 224 can form a PNPN semiconductor structure. Namely, the N-type well 224 in the regulation capacitor 202 and the PNP transistor 110 can form a parasitic SCR. The parasitic SCR can be equivalent to a circuit structure composed of a PNP transistor and a NPN transistor. Therefore, for simplicity's sake, in FIG. 1, the PNP transistor 110 and an NPN transistor 140 are used to denote a circuit structure of the parasitic SCR.

Referring to FIG. 1 and FIG. 2, an anode of the parasitic SCR is equivalent to the emitter of the PNP transistor 110, and the emitter of the PNP transistor 110 (i.e. the P+-type doped region 241) is configured in the N-type well 221. Moreover, a cathode of the parasitic SCR is composed of the N-type well 224 of the regulation capacitor 202, and the N-type well 224 of the regulation capacitor 202 is electrically connected to the ground. It should be noticed that when the N-type well 221 in the parasitic SCR, i.e. the base of the PNP transistor 110, is in a floating state, the noise come from the pad 101 is easy to trigger the parasitic SCR to form a latch-up path 203 and cause the latch-up effect.

Therefore, in order to avoid the aforementioned situation, when the internal circuit 102 normally operates, the adjustment circuit 130 provides a control voltage to the base of the PNP transistor 110, so that the N-type well 221 in the parasitic SCR is biased at the control voltage. For example, the adjustment circuit 130 transmits the power voltage VDD through the resistor 131. In other words, the adjustment circuit 130 provides the control voltage composed of the power voltage VDD to the base of the PNP transistor 110, so as to turn off the PNP transistor 110. In this way, formation of the latch-up path 203 is blocked to avoid generating the latch-up effect. In other words, the ESD protection device 100 uses the adjustment circuit 130 to avoid the latch-up effect during the normal operation of the internal circuit 102.

On the other hand, when the ESD event occurs, the electrostatic signal causes avalanche breakdown in the drain (i.e. the N+-type doped region 233) of the NMOS transistor 122, thereby turning on the NMOS transistors 121 and 122. In this way, the electrostatic signal is conducted to the ground through the resistor 131 and the NMOS transistors 121 and 122. In addition, the resistor 131 generates a voltage difference between the emitter and the base of the PNP transistor 110. When the voltage difference is high enough, the emitter-base junction of the PNP transistor 110 is turned on, thereby causing the PNP transistor 110 to be turned on. In this way, the electrostatic signal is conducted to the ground further through the PNP transistor 110.

Referring to FIG. 1, the ESD protection device 100 further includes a diode 150 and a resistor 160. A cathode of the diode 150 is electrically connected to the pad 101, and an anode of the diode 150 is electrically connected to the ground. A first end of the resistor 160 is electrically connected to the pad 101, and a second end of the resistor 160 is electrically connected to the internal circuit 102. In this way, the protection capability of the ESD protection device 100 can be further improved through the diode 150 and the resistor 160. Moreover, although the implementations of the protection circuit 120 and the adjustment circuit 130 are provided in the embodiment of FIG. 1, the invention is not limited thereto.

For example, the protection circuit 120 can be composed of an NMOS transistor, wherein a drain of the NMOS transistor is electrically connected to the base of the PNP transistor 110, and a gate and a source of the NMOS transistor are electrically connected to the ground.

Figure 3:
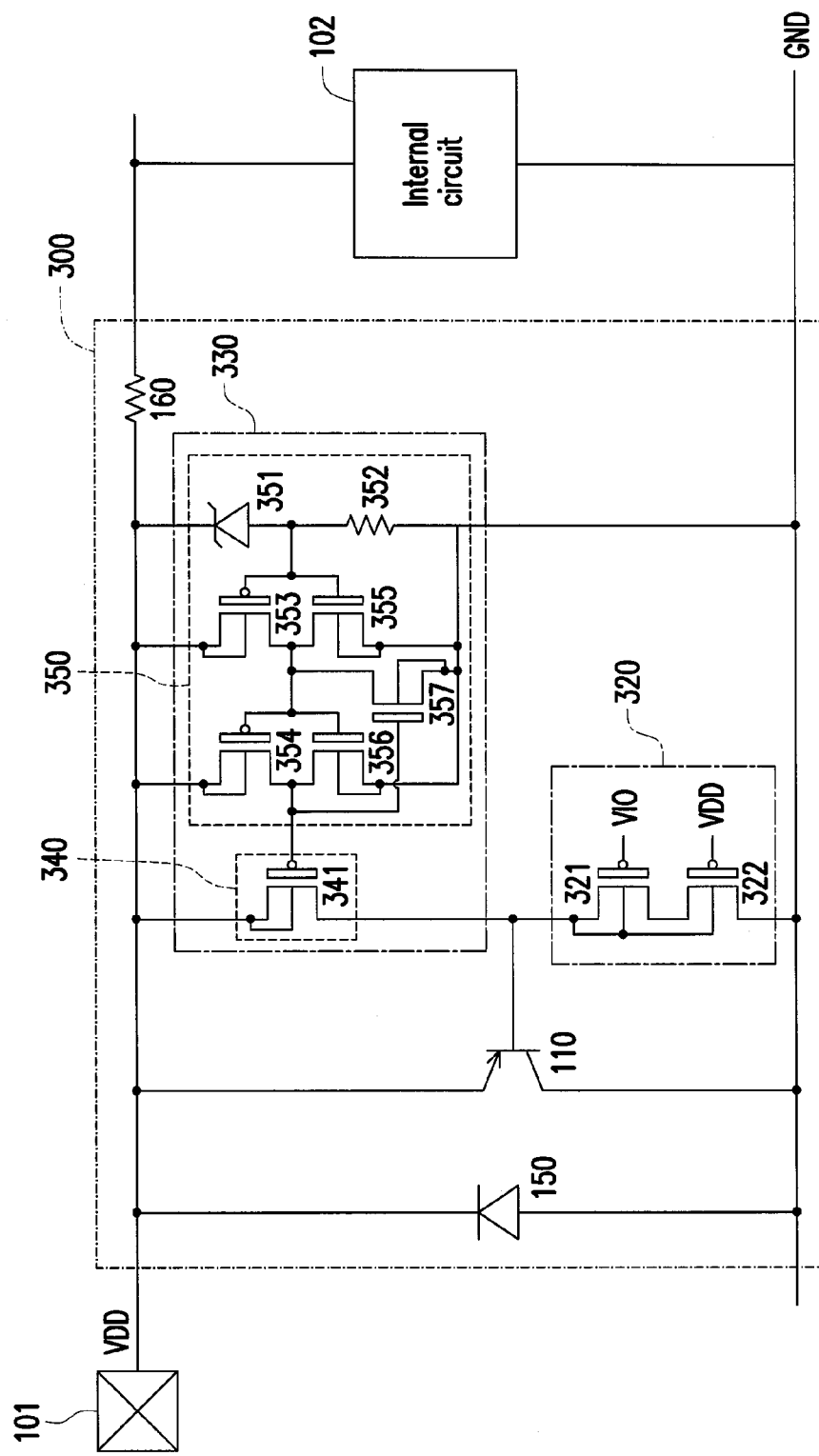
FIG. 3 is a schematic diagram of an ESD protection device according to another embodiment of the invention.

FIG. 3 is a schematic diagram of an ESD protection device according to another embodiment of the invention. The ESD protection device 300 of FIG. 3 is similar to the ESD protection device 100 of FIG. 1, and like referential numbers in FIG. 3 and FIG. 1 denote the same or like elements. Moreover, a main difference between the embodiments of FIG. 3 and FIG. 1 is that a protection circuit 320 of FIG. 3 includes two PMOS transistors 321 and 322 connected in series, and an adjustment circuit 330 in FIG. 3 includes a switch 340 and a control unit 350.

Regarding the protection circuit 320, a source of the PMOS transistor 321 is electrically connected to the base of the PNP transistor 110, and a gate of the PMOS transistor 321 receives an isolation voltage VIO. A source of the PMOS transistor 322 is electrically connected to a drain of the PMOS transistor 321, a gate of the PMOS transistor 322 receives the power voltage VDD, and a drain of the PMOS transistor 322 is electrically connected to the ground. In this way, the two PMOS transistors 321 and 322 connected in series have a parasitic lateral PNP transistor, so that the protection circuit 320 can provide a discharge path for guiding the electrostatic signal. Moreover, when the power voltage VDD is supplied to the pad 101, the PMOS transistor 321 can receive the isolation voltage VIO, and the PMOS transistor 322 can receive the power voltage VDD. Therefore, the signal come from the pad 101 is avoided to be conducted to the ground through the protection circuit 320, so as to suppress generation of the leakage current.

Regarding the adjustment circuit 330, the switch 340 is electrically connected between the emitter and the base of the PNP transistor 110, and the switch 340 is controlled by the control unit 350. For example, when the power voltage VDD is supplied to the pad 101, the control unit 350 turns on the switch 340 according to the power voltage VDD, such that the power voltage VDD is transmitted to the base of the PNP transistor 110 through the switch 340. In other words, when the internal circuit 102 normally operates, the adjustment circuit 330 provides the control voltage composed of the power voltage VDD to the base of the PNP transistor 110. In this way, formation of the latch-up path 203 shown in FIG. 2 is blocked to avoid generation of the latch-up effect.

On the other hand, when the ESD event occurs, the control unit 350 turns off the switch 340 according to the electrostatic signal come from the pad 101. Moreover, the electrostatic signal forward biases the emitter and the base of the PNP transistor 110. In this way, a part of the electrostatic signal is conducted to the ground through the PNP transistor 110, and the other part of the electrostatic signal is conducted to the ground through the discharge path provided by the protection circuit 320.

Further, the switch 340 includes a PMOS transistor 341, and the control unit 350 includes a Zener diode 351, a resistor 352, PMOS transistors 353 and 354, and NMOS transistors 355-357. A source of the PMOS transistor 341 is electrically connected to the emitter of the PNP transistor 310, a gate of the PMOS transistor 341 is electrically connected to the control unit 350, and a drain of the PMOS transistor 341 is electrically connected to the base of the PNP transistor 310.

A cathode of the Zener diode 351 is electrically connected to the source of the PMOS transistor 341. A first end of the resistor 352 is electrically connected to an anode of the Zener diode 351, and a second end of the resistor 352 is electrically connected to the ground. A source of the PMOS transistor 353 is electrically connected to the source of the PMOS transistor 341, and a gate of the PMOS transistor 353 is electrically connected to the first end of the resistor 352. A drain of the NMOS transistor 355 is electrically connected to a drain of the PMOS transistor 353, a gate of the NMOS transistor 355 is electrically connected to the gate of the PMOS transistor 353, and a source of the NMOS transistor 355 is electrically connected to the ground.

A source of the PMOS transistor 354 is electrically connected to the source of the PMOS transistor 341, a gate of the PMOS transistor 354 is electrically connected to the drain of the PMOS transistor 353, and a drain of the PMOS transistor 354 is electrically connected to the gate of the PMOS transistor 341. A drain of the NMOS transistor 356 is electrically connected to the drain of the PMOS transistor 354, a gate of the NMOS transistor 356 is electrically connected to the gate of the PMOS transistor 354, and a source of the NMOS transistor 356 is electrically connected to the ground. A drain of the NMOS transistor 357 is electrically connected to the gate of the NMOS transistor 356, a gate of the NMOS transistor 357 is electrically connected to the drain of the NMOS transistor 356, and a source of the NMOS transistor 357 is electrically connected to the ground.

In view of operation, the PMOS transistor 353 and the NMOS transistor 355 construct a first inverter, and the PMOS transistor 354 and the NMOS transistor 356 construct a second inverter. Moreover, a breakdown voltage of the Zener diode 351 is greater than the power voltage VDD. Therefore, when the power voltage VDD is supplied to the pad 101, the Zener diode 351 cannot conduct. Now, the resistor 352 provides a low level signal, and the low level signal is inverted twice by the first inverter and the second inverter. Therefore, the PMOS transistor 341 can receive the low level signal, and is switched to a turn-on state.

On the other hand, when the ESD event occurs, the electrostatic signal come from the pad 101 turns on the Zener diode 351, such that the Zener diode 351 provides a high level signal, and the high level signal is inverted twice by the first inverter and the second inverter. Therefore, the PMOS transistor 341 can receive the high level signal, and is switched to a turn-off state. Moreover, the NMOS transistor 357 is turned on in response to the high level signal to latch the PMOS transistor 354 to the turn-on state. Therefore, the PMOS transistor 341 is ensured to receive the high level signal.

Figure 4:
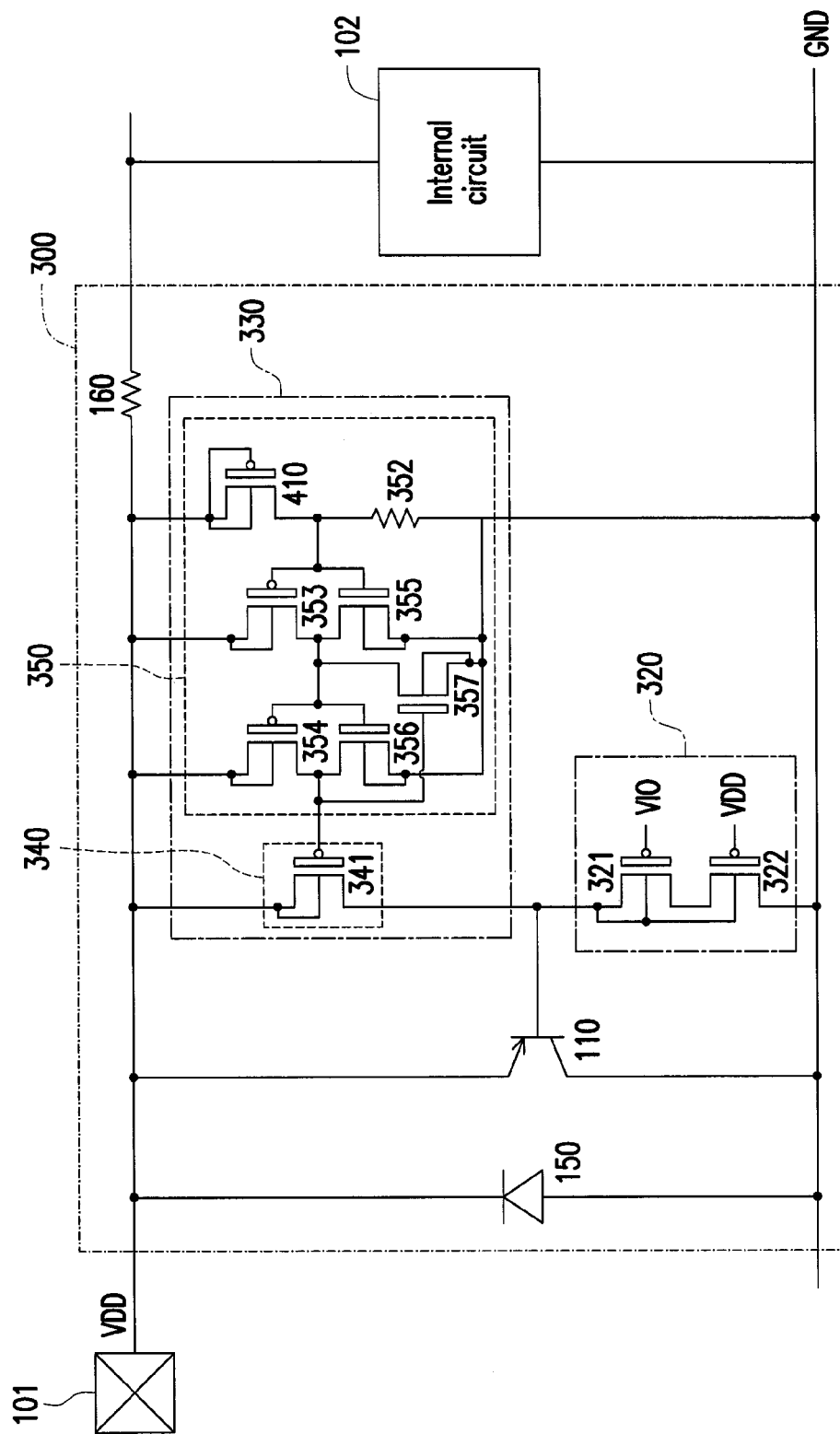
FIG. 4 is a schematic diagram of an ESD protection device according to still another embodiment of the invention.

It should be noticed that in other embodiments, the function of the Zener diode 351 of FIG. 3 can be implemented through a transistor pattern. For example, FIG. 4 is a schematic diagram of an ESD protection device according to still another embodiment of the invention. As shown in FIG. 4, a PMOS transistor 410 having a diode connection configuration can be used to replace the Zener diode 351 of FIG. 3. In detail, a drain and a gate of the PMOS transistor 410 are electrically connected to the source of the PMOS transistor 341, and a source of the PMOS transistor 410 is electrically connected to the first end of the resistor 352. Connection structures and operation methods of the other components in the embodiment of FIG. 4 have been described in the embodiment of FIG. 3, and details thereof are not repeated.

In summary, in the ESD protection device of the invention, the adjustment circuit is disposed between the emitter and the base of the PNP transistor, and a control voltage is provided to the base of the PNP transistor through the adjustment circuit. In this way, when the internal circuit normally operates, a forward biasing of the emitter and the base of the PNP transistor is prevented, so as to avoid occurrence of the latch-up effect.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electrostatic discharge protection device, comprising:
   a PNP transistor, having an emitter electrically connected to a pad, and a collector electrically connected to a ground;
   a protection circuit, electrically connected between a base of the PNP transistor and the ground, and providing a discharge path, wherein when an electrostatic signal occurs on the pad, the electrostatic signal is conducted to the ground through the discharge path and the PNP transistor; and
   an adjustment circuit, electrically connected between the emitter and the base of the PNP transistor, wherein the adjustment circuit comprises:
   a switch, electrically connected between the emitter and the base of the PNP transistor; and a control unit, turning on the switch according to the power voltage, and turning off the switch according to the electrostatic signal, wherein the control unit comprises:
    a Zener diode, having a cathode electrically connected to the emitter of the PNP transistor; and
    a first resistor, having a first end electrically connected to an anode of the Zener diode, and a second end electrically connected to the ground,
    when a power voltage is supplied to the pad, the adjustment circuit provides a control voltage to the base of the PNP transistor according to the power voltage, so as to prevent the emitter and the base of the PNP transistor from being forward biased.

2. The electrostatic discharge protection device as claimed in claim 1, wherein the switch comprises a first PMOS transistor, a source of the first PMOS transistor is electrically connected to the emitter of the PNP transistor, a gate of the first PMOS transistor is electrically connected to the control unit, and a drain of the first PMOS transistor is electrically connected to the base of the PNP transistor.

3. The electrostatic discharge protection device as claimed in claim 2, wherein the control unit further comprises:
    a second PMOS transistor, having a source electrically connected to the source of the first PMOS transistor, and a gate electrically connected to the first end of the first resistor;
    a first NMOS transistor, having a drain electrically connected to a drain of the second PMOS transistor, a gate electrically connected to the gate of the second PMOS transistor, and a source electrically connected to the ground;
    a third PMOS transistor, having a source electrically connected to the source of the first PMOS transistor, a gate electrically connected to the drain of the second PMOS transistor, and a drain electrically connected to the gate of the first PMOS transistor;
    a second NMOS transistor, having a drain electrically connected to the drain of the third PMOS transistor, a gate electrically connected to the gate of the third PMOS transistor, and a source electrically connected to the ground; and
    a third NMOS transistor, having a drain electrically connected to the gate of the second NMOS transistor, a gate electrically connected to the drain of the second NMOS transistor, and a source electrically connected to the ground.

4. The electrostatic discharge protection device as claimed in claim 1, wherein the protection circuit comprises:
    a first PMOS transistor, having a drain electrically connected to the base of the PNP transistor, and a gate receiving an isolation voltage; and
    a second PMOS transistor, having a source electrically connected to the drain of the first PMOS transistor, a gate receiving the power voltage, and a drain electrically connected to the ground.

5. The electrostatic discharge protection device as claimed in claim 1, further comprising a diode, wherein a cathode of the diode is electrically connected to the pad, and an anode of the diode is electrically connected to the ground.

6. The electrostatic discharge protection device as claimed in claim 1, further comprising a second resistor, wherein a first end of the second resistor is electrically connected to the pad, and a second end of the second resistor is electrically connected to an internal circuit.

* * * * *